(12) United States Patent
Vermeer et al.

(10) Patent No.: US 11,042,095 B2
(45) Date of Patent: Jun. 22, 2021

(54) OPTICAL BEAM HOMOGENIZER BASED ON A LENS ARRAY

(71) Applicant: Kulicke & Soffa Liteq B.V., Eindhoven (NL)

(72) Inventors: Adrianus Johannes Petrus Maria Vermeer, Eindhoven (NL); Mikhail Yurievich Loktev, Eindhoven (NL); Derk Andre Kort, Eindhoven (NL)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 16/334,347

(22) PCT Filed: Sep. 18, 2017

(86) PCT No.: PCT/NL2017/050612
§ 371 (c)(1),
(2) Date: Mar. 18, 2019

(87) PCT Pub. No.: WO2018/052298
PCT Pub. Date: Mar. 22, 2018

(65) Prior Publication Data
US 2020/0183286 A1 Jun. 11, 2020

(30) Foreign Application Priority Data
Sep. 19, 2016 (NL) .................................... 2017493

(51) Int. Cl.
*G03B 27/72* (2006.01)
*G03F 7/20* (2006.01)
*G02B 27/09* (2006.01)

(52) U.S. Cl.
CPC ..... *G03F 7/70075* (2013.01); *G02B 27/0927* (2013.01); *G02B 27/0961* (2013.01)

(58) Field of Classification Search
CPC ............ G03F 7/70075; G02B 27/0927; G02B 27/0961; G02B 5/005
See application file for complete search history.

(56) References Cited

U.S. PATENT DOCUMENTS 7,428,039 B2   9/2008  Ferber
2016/0109806 A1*  4/2016  Zeng ..................... G02B 5/005
                                                                355/67

FOREIGN PATENT DOCUMENTS

WO       WO00/11706         3/2000
WO       WO2011039261 A2    4/2011

OTHER PUBLICATIONS

International Search Report completed on Jan. 18, 2018, International Application No. PCT/NL2017/050612.

(Continued)

*Primary Examiner* — Peter B Kim
(74) *Attorney, Agent, or Firm* — Christopher M Spletzer, Sr.

(57) ABSTRACT

A correction mask for an optical beam homogenizer includes a lens array. The correction mask is configured to provide a shaped initial beam profile. A subset of a plurality of optical paths between the incoming light beam and the illumination plane is at least partially blocked by the correction mask to provide a further homogenized beam profile having a further reduced light intensity variance with respect to an initial homogenized beam profile. The mask includes a plurality of submasks arranged according to a mask grid layout matching the lens grid layout of the lens array. Each one of the submasks is designed with a specific submask pattern to shape the respective subarea of the initial beam profile passing a specific one of the lenslets.

20 Claims, 8 Drawing Sheets

(56) References Cited

OTHER PUBLICATIONS

Cecile Veauvy et al. : "Direct observation of vortices in an array of holes at low temperature : temperature dependance and first visualization of localized superconductivity". Cornell University library, May 28, 2004.
Anonymous: "Pochoir maped technic M277620 pour Gerdes de diametre 1 a 35 mm, orange: Amazon.fr : Fournitures de bureau", Mar. 24, 2009 (Mar. 24, 2009) XP055439018, retrieved from the Internet : URL:https://www.amazon.fr/Pochoir-maped-technic-M277620-diametre/dp/B001B2NBWU/ref=sr_1_5/258-1460556-9230264?ie=UTF8&qid=1515490111&sr 8-5&keywords=normographe. p. 1.

* cited by examiner

OPTICAL BEAM HOMOGENIZER BASED ON A LENS ARRAY

CROSS REFERENCE TO RELATED APPLICATIONS

This application is a U.S. National Phase filing of International Patent Application No. PCT/NL2017/050612 filed Sep. 18, 2017, which claims the priority of the Netherlands Patent Application No. 2017493 filed Sep. 19, 2016. The disclosures of these applications are hereby incorporated by reference in their entirety.

FIELD

The invention relates to an optical beam homogenizer based on a lens array, a lithographic system including the homogenizer, a correction mask for improving the homogenizer, a method for manufacturing the correction mask, and software instructions to perform the method.

BACKGROUND

In optical systems, such as used in lithography, it is desired to provide illumination with minimal intensity variation, i.e. a beam having a homogenous (flattop) intensity profile. For example, in a lithographic projection stepper, a mask depicting a circuit pattern (reticle) is homogeneously illuminated for projection and lithographic patterning onto a target substrate (wafer). To transform an initial beam profile into a flat intensity profile various homogenizing optics can be used.

In a typical (imaging or non-imaging) lens array homogenizer, a lens array splits a generally collimated beam (e.g. having Gaussian or flattop profile) into a large number of beamlets with separate optical paths that may be expanded to the same size and superimposed at the same output position (illumination plane). Basically, the lens array homogenizer mixes different parts of the initial beam profile to achieve a homogenized beam profile with a generally good uniform intensity distribution. Still the uniform intensity distribution is not ideal since it may be constructed by summing up non-homogeneous parts of the beam. Also, the intensity profile can be affected by manufacturing errors, such as surface errors of the (micro)optical elements and the quality of antireflection coatings. To comply with challenging uniformity requirements (e.g. <1% variance), further improvement of the initial homogenized beam profile is desired.

U.S. Pat. No. 7,428,039 B2 describes an optical system for projecting a laser-beam on a mask to illuminate the mask. The system includes a beam homogenizing arrangement including spaced arrays of (cylindrical) microlenses. The beam homogenizing arrangement redistributes light in the laser beam such that the intensity of light in the laser-beam on the mask is nearly uniform along a transverse axis of the laser-beam. A stop extending partially into the laser-beam between the microlens arrays provides a more uniform light-intensity on the mask along the transverse axis than can be achieved by the microlens arrays alone. However, the type of correction may be limited, difficult to control, and only achieved in one direction at a time due to the reliance on cylindrical lenses.

WO 2011/039261 discloses embodiments with stops extending into the beam profile (FIG. 12B) or wherein mask patterns are formed by shifting rectangular edges (FIG. 12E). However these embodiments may still not provide the desired end profile and homogeneity control.

It is desired to improve control over the homogeneity of the illuminator beam profile.

SUMMARY

One aspect of the present disclosure provides an optical beam homogenizer including a lens array and a correction mask.

In some embodiments, the lens array may be configured to receive an incoming light beam. The incoming light beam has an initial beam profile with an initial light intensity variance to be homogenized. The lens array is formed by a plurality of lenslets arranged according to a lens grid layout. Preferably, the lens grid layout spans an area of the initial beam profile. For example, each lenslet is arranged in a respective optical path to project a partial image (representation) of a respective subarea of the initial beam profile at an illumination plane. A plurality of the partial images may thus be projected to overlap at the illumination plane to form an initial homogenized beam profile of the initial beam profile at the illumination plane. By said overlapping of partial images, the initial homogenized beam profile can have an initial reduced light intensity variance with respect to the initial light intensity variance in the initial beam profile of the incoming light beam.

In embodiments with such a lens array, the correction mask can be configured to provide a shaped initial beam profile. For example, a subset of the plurality of optical paths between the incoming light beam and the illumination plane is at least partially blocked by the correction mask to provide a further homogenized beam profile having a further reduced light intensity variance with respect to the initial homogenized beam profile. Thereto, the mask preferably includes a plurality of submasks arranged according to a mask grid layout matching the lens grid layout of the lens array. The mask grid layout may thus be aligned with the lens grid layout. For example, each one of the submasks can be designed with a specific submask pattern to shape the respective subarea of the initial beam profile passing a specific one of the lenslets.

By using a plurality of submasks with respective patterns designed to shape subareas of the initial beam profile passing respective lenslets, individual control may be gained over the projection of a select number of partial images. In particular it can be accurately controlled which parts of the selected partial images are projected onto the illumination plane to produce the further homogenized beam profile. By aligning the edges of respective submasks with the edges of respective lenslets, the blocked parts of the initial beam profile may provide a correspondingly lower intensity of the projected image at a position of the blocked part. For example, if an outer edge of a lenslet is blocked by a respective submask, this may result in a lowered intensity at an outer edge of the homogenized beam profile. This can thus be used to correct an above average intensity at the edge of the initial homogenized beam profile. Similarly, also other parts of the profile can be corrected. Accordingly, improved control is gained over the homogeneity of the illuminator beam profile.

It will be appreciated that the present disclosure is particularly suitable in combination with spherical (e.g. elliptical) lenslets, i.e. not limited to cylindrical lens arrays. Accordingly, the grid of lenslets may be a two-dimensional grid with sequences of a plurality of lenslets extending in either direction of the grid. For example, the lenslets may be microlenses with dimensions between one hundred and three thousand micrometers, preferably between one and three millimeters. Typically, a height and width of the submasks may be adapted to match a height and width of the lenslets, e.g. the grid spacing of submasks is the same as that of the lens array.

Edges of the submasks may be adapted to match a desired correction of the initial homogenized beam profile. For a rotation symmetric beam profile, the submasks preferably have respective circular (e.g. elliptical) edges defining an area of blocked light corresponding to part of the profile to be corrected. The centers of the circular edges of the submasks may be aligned with centers of the respective lenslets. For example to correct an intensity profile with relatively high intensity at the edges (e.g. flat top with sagged intensity in the middle), submasks may be designed to block light at an outer circular edge while passing light though the middle. Conversely, for the opposite case where the intensity is too high in the middle, the middle part may be blocked. Also combinations are possible depending on the initial homogenized beam profile to be corrected.

Typically, the submasks each have a symmetric pattern, e.g. point-symmetric and/or symmetric in one or two orthogonal directions. To match an image passed through the lenslet (e.g. having square or rectangular dimension), the submask patterns can be stretched in either of the dimensions. By providing each of the submask patterns with a fixed position in the mask grid layout, alignment is relatively simple. For example, a correction mask with two, three, four, or more submasks having fixed relative positions, is aligned with a corresponding lens array.

Distributing the submasks symmetrically about a center of the mask grid layout can be beneficial, e.g. in minimizing the influence of intensity gradient over the lenslet area and/or shifting of the beam. For example, in a symmetric beam profile the gradient in a first lenslet area may be compensated by the gradient in a second lenslet area on an opposite side of the center. Furthermore, if the beam is shifted, the intensity at one lenslet area may decrease while intensity at the other area increases. To further improve the compensatory effects, a position and pattern of the submasks may be arranged according to a point-symmetric distribution, e.g. wherein a first submask pattern is the same as a half-turn rotated second submask pattern opposite the center.

To achieve further smoothing of the final beam profile, it may be desired to provide a collection of different submask patterns. For example, the correction mask includes a collection of two, three, four, or more differently patterned submasks. Depending on the number of lenslets used and an intensity distribution over the lenslet areas, each lenslet area may contribute a small effect to the resulting profile. The effects may be increased by providing the correction mask with repeated occurrences of each pattern, especially when used at the edges of the beam profile where intensity may be low.

Typically, the mask may span an entire area of the lens array with transparent and opaque areas. For example, the mask may be defined by submasks that block parts of the light passing respective lenslets to shape their resulting beam profiles. The areas of the mask not blocking the light may be transparent, e.g., include transparent material. This may allow the submasks to be placed anywhere in the mask layout, e.g. at a position with desired intensity to achieve a large effect. On the other hand, for some applications (e.g., extreme ultraviolet) it may be desired to provide as little material in the way of the beam as possible. In such a case, and in other cases, the mask may be defined by an aperture without any material where the submask patterns are disposed around an edge of the aperture.

In some cases, especially using an edge mask without material at the aperture, submask patterns comprising two or more disconnected parts can be difficult to achieve. Accordingly, the intended submask pattern can be distributed over two or more submasks with respective subpatterns. For example, each submask can be formed by a subset of the two or more disconnected parts to allow attachment of the subpattern to an edge of a central aperture without material. This allows forming patterns at an edge of the mask which would otherwise have disconnected parts floating in midair. For example, the subpatterns form two halves that together make up the intended submask pattern wherein one half of a respective subpattern forms a respective half of the intended submask pattern. Within that submask, the other (disconnected) half may be free of material or completely filled with material, intended to block light of the incoming beam. The submask representing the other half can be a mirror or rotated duplicate of the first half.

To achieve a desired effect, the correction mask is disposed in a light path of the beam, preferably at (or near) a conjugate plane of the illumination plane with respect to the projection system. In this way, the patterns of the submasks may be imaged onto the illumination plane. By disposing the correction mask close to the lens array, alignment can be relatively easy. For example, the correction mask can be made to fit against the lens array. By arranging the mask in an optical path in front of the lens array, e.g. in a collimated part of the incoming light beam, a distance to the lens array may be less critical.

It will be appreciated that the optical beam homogenizer can be part of an illuminator system with lenses and or mirrors configured to project a homogeneous light beam at the illumination plane. The homogeneous light beam may be formed by overlapping projections of different parts of the incoming light beam. In some embodiments, the optical beam homogenizer includes two lens arrays. Also alternative and/or further lenses and/or mirrors may be used. For example a Fourier lens can be used as part of the projection system.

The optical beam homogenizer may find useful application as part of an imaging system. For example, a pattern to be imaged is placed at or near the illumination plane of the homogenizer to be homogeneously illuminated. For example, a reticle with a circuit pattern can be imaged onto a wafer. Some aspects of the present disclosure may thus provide a lithographic system comprising the optical beam homogenizer as described herein.

Other or further aspects of the present disclosure may relate to a correction mask as such. The correction mask is intended for improving a homogenizer based on a lens array to provide a further homogenized beam profile having a further reduced light intensity variance with respect to an initial homogenized beam profile of the homogenizer without the correction mask. In some embodiments, the mask includes a plurality of submasks arranged according to a mask grid layout matching a lens grid layout of the lens array, wherein the mask grid layout is to be aligned with the lens grid layout, wherein each one of the submasks is designed with a specific submask pattern to shape the respective subarea of the initial beam profile passing a specific one of the lenslets. For example, the correction mask is an apodization mask, e.g. aperture mask with a patterned edge.

Further aspects of the present disclosure may also provide a method for manufacturing a correction mask for improving an optical beam homogenizer with a lens array as described herein. In some embodiments, the method includes configuring the correction mask to provide a shaped initial beam profile. A subset of the plurality of optical paths between the incoming light beam and the illumination plane is at least partially blocked by the correction mask to provide a further homogenized beam profile having a further reduced light intensity variance with respect to the initial homogenized beam profile. Furthermore, the mask includes a plurality of submasks arranged according to a mask grid layout matching the lens grid layout of the lens array. The mask grid layout is to be aligned with the lens grid layout. Each one of the submasks is designed with a specific submask pattern to shape the respective subarea of the initial beam profile passing a specific one of the lenslets.

By measuring an initial homogenized beam profile at the illumination plane of the optical beam homogenizer without the correction mask, it can be determined what the desired correction should be. For example, the correction mask can be designed by adding a plurality of submasks. Each submask can have an edge shaped to partially block a subarea of the initial beam profile corresponding to a respective lenslet. The combined effects can be calculated and or measured. For example, the blocked part of the subarea may correspond to a part of the measuring initial homogenized beam profile having a higher than average light intensity. By lowering the intensity at that subarea an overall improvement of the homogeneity may be achieved.

Additionally, or alternatively, by measuring the initial beam profile of the incoming light beam at a position where the correction mask is to be placed, a relative contribution of light passing different subareas of the mask grid layout may be measured and/or calculated. A mask grid layout can be generated with different submask patterns covering different subareas of the mask grid layout. A correction profile can thus be calculated based on the different submask patterns covering different subareas of the mask grid layout and their relative contribution. In this way, the correction profile can be optimized to provide a further homogenized beam profile.

The optimizing of the correction profile may include adaptation of various parameters including e.g. variation of an edge shape of the different submask patterns, variation of a number of each of the submask patterns used, and/or variation a position of the submask patterns with respect to the measured initial beam profile. For example, by varying a respective diameter of submask edges in one or more of the different submask patterns, an extent of the blocked edge can be varied. For example, by varying the number of submasks used, the total corrective effect can be varied. For example, by varying a position of the submasks, a position having relatively low or high contribution can be chosen to vary the amount of correction.

Some aspects as described herein may be embodied as a non-transitory computer readable medium with software instructions that when executed e.g. cause a computer to perform steps of the methods as described herein. The computer readable medium may also be part of a corresponding system as described herein, e.g. stored in memory or otherwise accessible.

BRIEF DESCRIPTION OF DRAWINGS

These and other features, aspects, and advantages of the apparatus, systems and methods of the present disclosure will become better understood from the following description, appended claims, and accompanying drawing wherein:

DETAILED DESCRIPTION

Figure 1A:
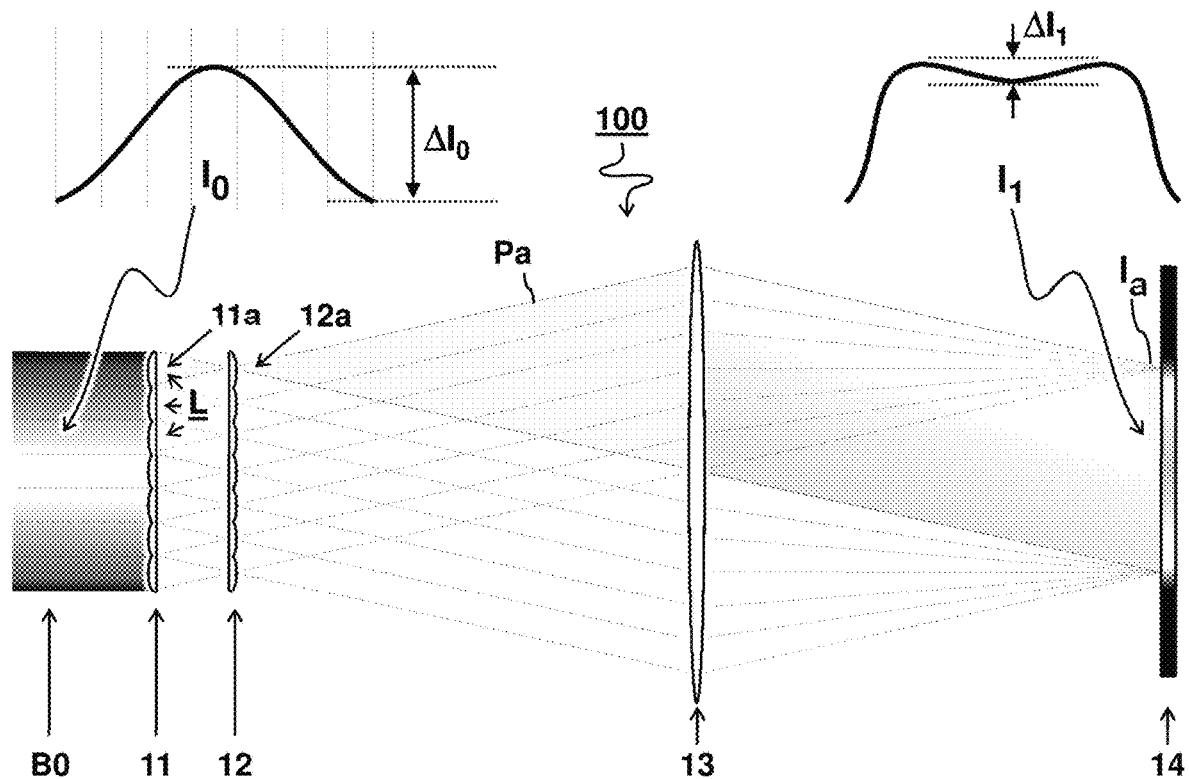
FIGS. 1A and 1B schematically illustrate an exemplary embodiment of the invention including an optical beam homogenizer without and with correction mask, respectively.

In some instances, detailed descriptions of well-known devices and methods may be omitted so as not to obscure the description of the present systems and methods. Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise.

The invention is described more fully hereinafter with reference to the accompanying drawings, in which embodiments of the invention are shown. The description of the exemplary embodiments is intended to be read in connection with the accompanying drawings, which are to be considered part of the entire written description. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout.

Figure 1B:
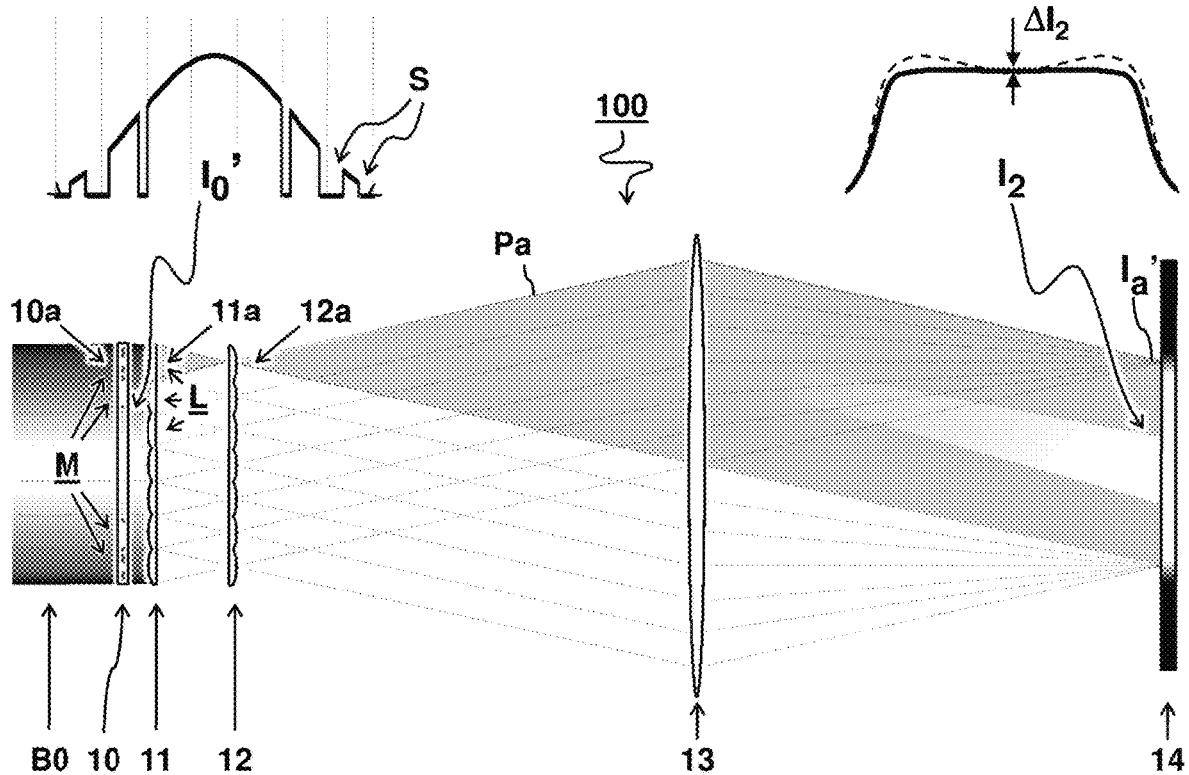

FIGS. 1A and 1B schematically illustrate an embodiment of an optical beam homogenizer 100 without and with correction mask 10, respectively.

In the present figures, the optical beam homogenizer 100 includes a lens array 11 configured to receive an incoming light beam B0. The incoming light beam B0 has an initial beam profile I0 with an initial light intensity variance ΔI0 to be homogenized. The lens array 11 is formed by a plurality of lenslets 11a arranged according to a lens grid layout L spanning an area of the initial beam profile I0. Each lenslet 11a is arranged in a respective optical path Pa to project a partial image Ia of a respective subarea of the initial beam profile I0 at an illumination plane 14. A plurality of the partial images Ia is projected to overlap at the illumination plane 14 to form an initial homogenized beam profile I1 of the initial beam profile I0 at the illumination plane 14. By said overlapping of partial images Ia, the initial homogenized beam profile I1 has an initial reduced light intensity variance ΔI1 with respect to the initial light intensity variance ΔI0 in the initial beam profile I0 of the incoming light beam B0.

As shown in FIG. 1B, the optical beam homogenizer 100 preferably includes a correction mask 10 configured to provide a shaped initial beam profile I0'. A subset of the plurality of optical paths Pa between the incoming light beam B0 and the illumination plane 14 is at least partially blocked by the correction mask 10. This provides a further homogenized beam profile I2 having a further reduced light intensity variance ΔI2 with respect to the initial homogenized beam profile I1 without mask, as shown in FIG. 1A.

As described herein, it is preferred that the mask includes a plurality of submasks 10a arranged according to a mask grid layout M matching the lens grid layout L of the lens array 11. The mask grid layout M is aligned with the lens grid layout L. Each one of the submasks 10a is designed with a specific submask pattern to shape S the respective subarea of the initial beam profile I0 passing a specific one of the lenslets 11a.

In one embodiment, each submask 10a includes edges that are aligned with edges of a respective lenslet 11a to individually shape a part of the light beam in the respective optical path Pa of the respective lenslet 11a. Preferably, the lenslets 11a are spherical or elliptical lenses. For example, the lenslets 11a are microlenses with dimensions between one hundred and three thousand micrometer, preferably between one and three millimeter. In another or further embodiment, the grid of lenslets 11a is a two dimensional grid with sequences of a plurality of lenslets extending in either direction of the grid. Preferably, a height and width of the submasks 10a are adapted to match (e.g. being the same as) a height and width of the lenslets 11a.

In the embodiment shown, the correction mask 10 is disposed in preferred position in a light path before the lens array 11. In principle, the mask may be positioned elsewhere, e.g. directly after the lens or another position. The correction mask 10 is preferably placed as close as possible to the corresponding lens array to avoid diffraction effects, e.g. within a distance of less than one centimeter, less than half a centimeter, or even less e.g. less one millimeter. In some embodiments, the correction mask 10 is disposed in a collimated light beam, in particular the incoming light beam B0. For example, the correction mask 10 is disposed at or near an object plane which is imaged at the illumination plane 14. In other words, the illumination plane 14 may be a conjugate plane of the plane where the mask is positioned. In one embodiment, the correction mask 10 spans an entire area of the lens array 11.

In some embodiments, the optical beam homogenizer 100 is part of an illuminator system with lenses 11,12,13. Alternative or in addition to lenses, also curved mirrors (not shown) can be used for shaping and/or projecting the beam. In principle, also the mask 10 may be a reflective rather than a transmissive mask. Some optical components may also be integrated, e.g. the mask may be integrated with the lens array. For example, a mask may be deposited onto a transmissive or reflective lens (or mirror) array.

In the embodiment shown, the optical beam homogenizer 100 includes two lens arrays 11, 12. The second array may not be necessary in some alternative configurations. In the present embodiment, the second lens array 12 is disposed at a focal plane of the first lens array 11. Further shown in this embodiment is that the optical beam homogenizer 100 may include a lens 13, e.g., so-called Fourier lens. For example, the second lens array 12 is disposed at a first focal plane of the Fourier lens 13. For example, the illumination plane 14 is disposed at a second focal plane of the Fourier lens 13. The combined effect of the projection system 11, 12, 13 is to project a homogeneous light beam at the illumination plane 14. The homogeneous light beam is formed by overlapping projections of different parts of the incoming light beam B0.

In some embodiments, the optical beam homogenizer 100 is part of a larger imaging system (not shown). For example, a pattern to be imaged is placed at or near the illumination plane 14 to be homogeneously illuminated, e.g. a reticle with a circuit pattern. For example, the optical beam homogenizer 100, as described herein, may find application in a lithographic system.

Figure 2A:
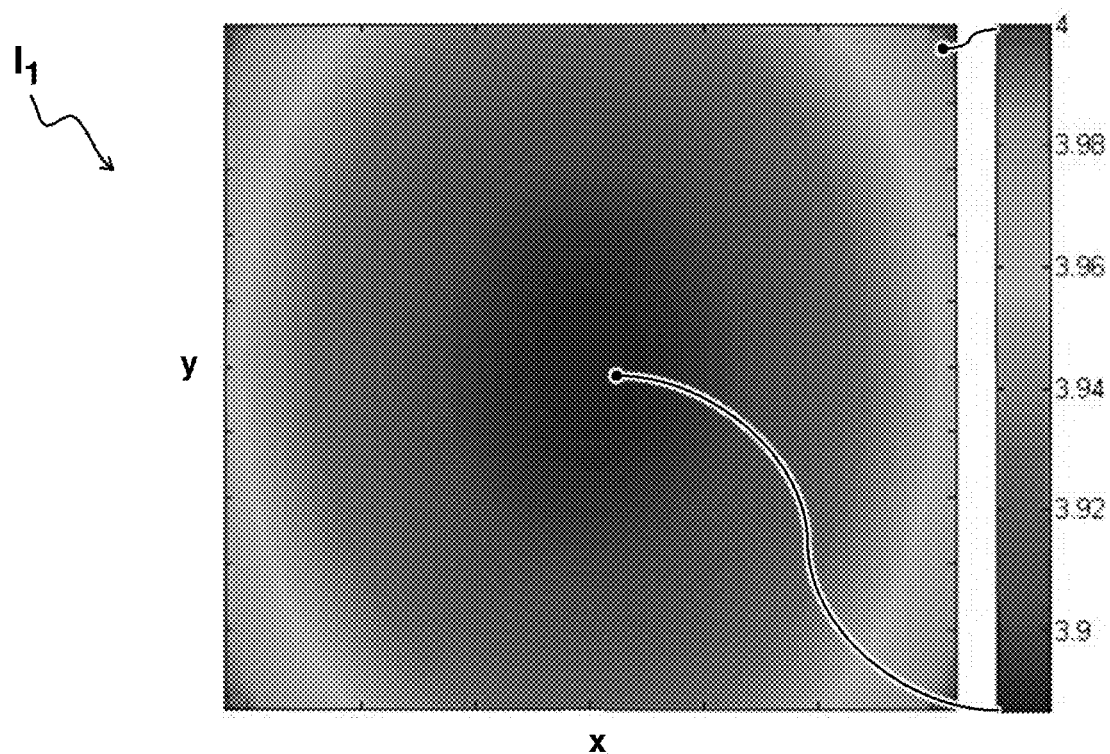
FIGS. 2A and 2B respectively illustrate a two dimensional and profile plot of an intensity distribution of an initial homogenized beam profile.
Figure 2B:
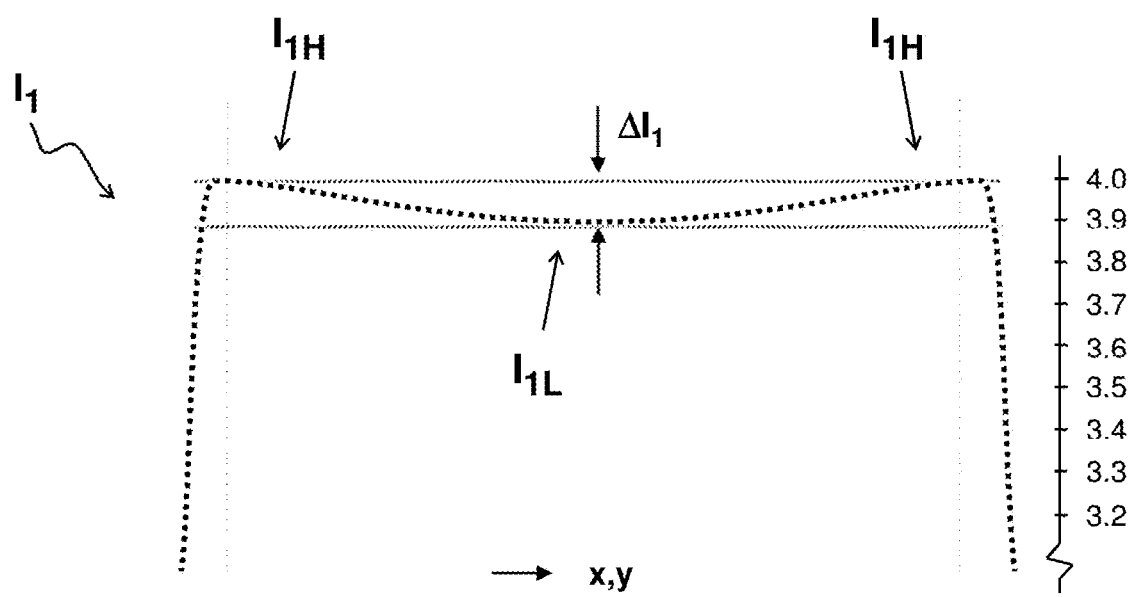

FIGS. 2A and 2B respectively illustrate a two dimensional and profile plot of an intensity distribution of an initial homogenized beam profile I1. It may be observed that the initial homogenized beam profile I1 is rather homogenous, e.g. having an intensity in a range between 3.88 and 4.00 (a.u). For example, such initial homogenized beam profile I1 may be obtained by homogenizing an initially Gaussian beam profile using a homogenizer 100 without correction mask as shown in FIG. 1A.

Figure 3A:
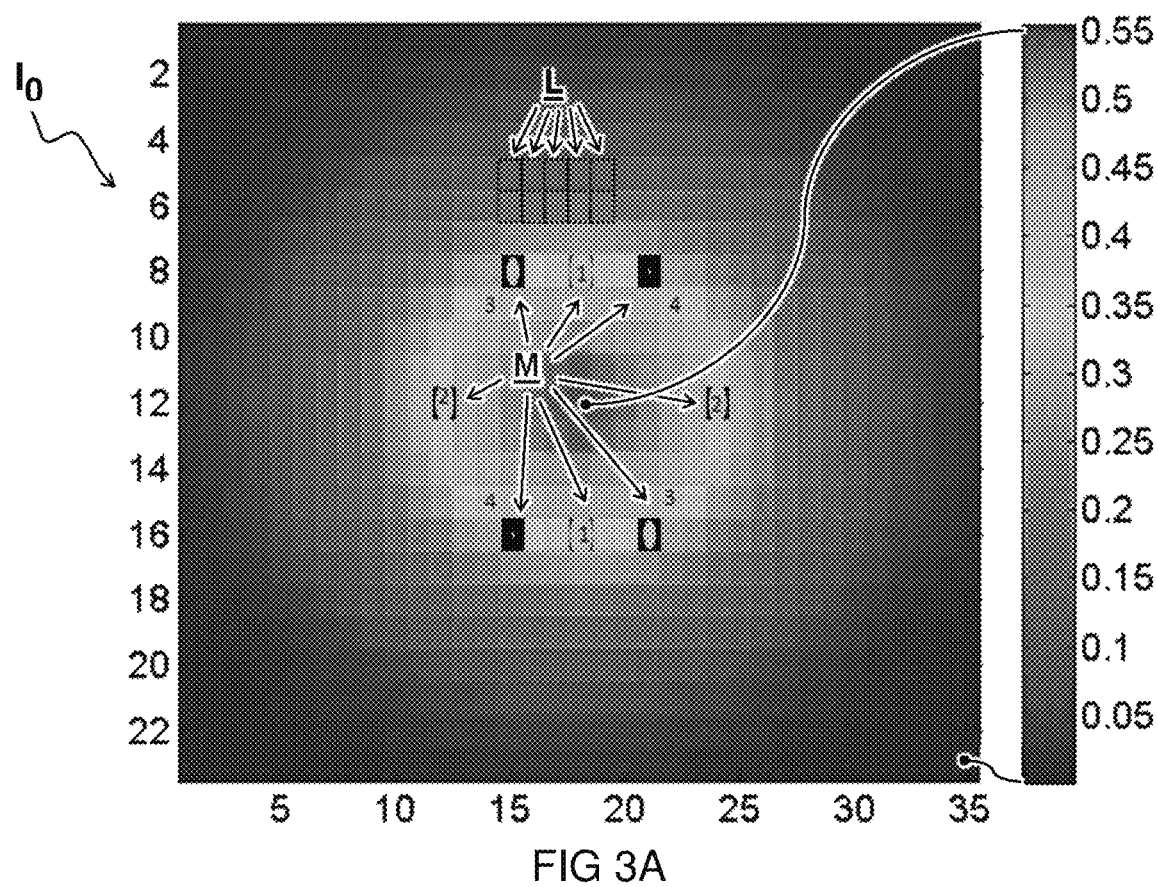
FIGS. 3A and 3B respectively illustrate a two dimensional and profile plot of an intensity distribution of an initial beam profile.
Figure 3B:
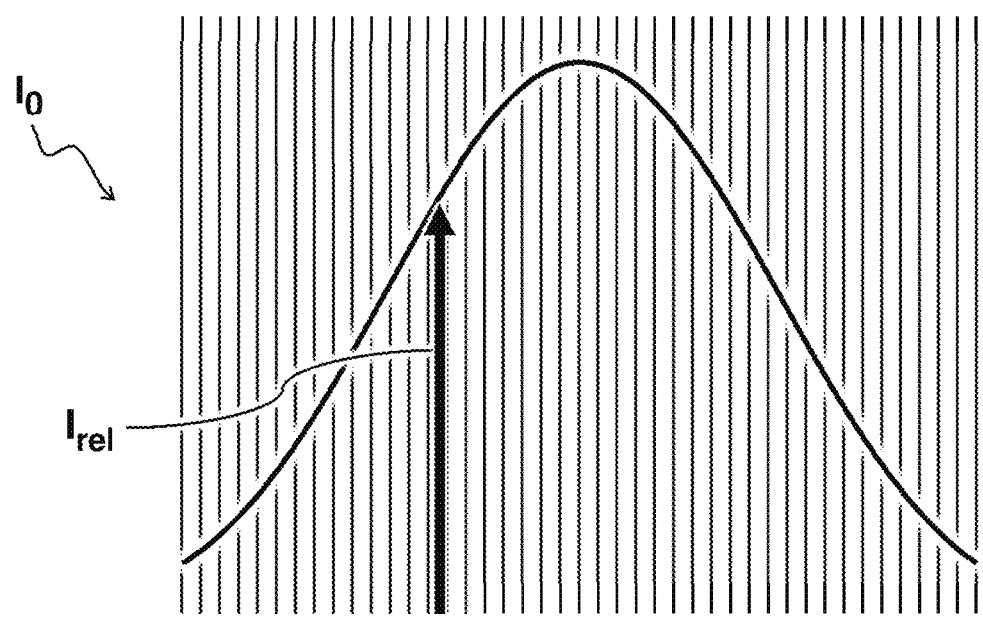

FIGS. 3A and 3B respectively illustrate a two dimensional and profile plot of an intensity distribution of an initial beam profile I0. As illustrated in FIG. 3A, each particular lenslet in the layout L makes a small contribution in the total intensity pattern, which is proportional to the average intensity of the incoming beam over the lenslet.

Figure 4A:
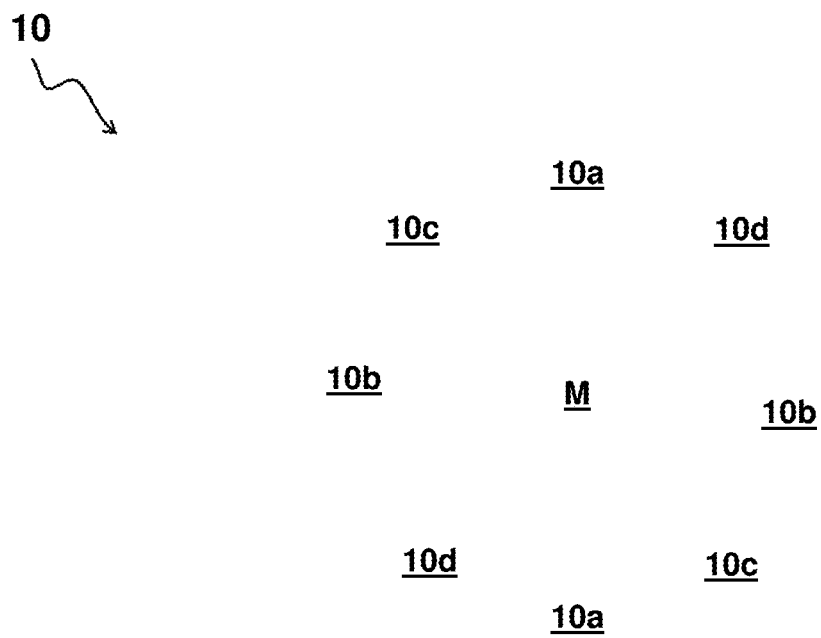
FIGS. 4A and 4B illustrate a first embodiment of a correction mask and corresponding submask patterns, respectively.
Figure 4B:
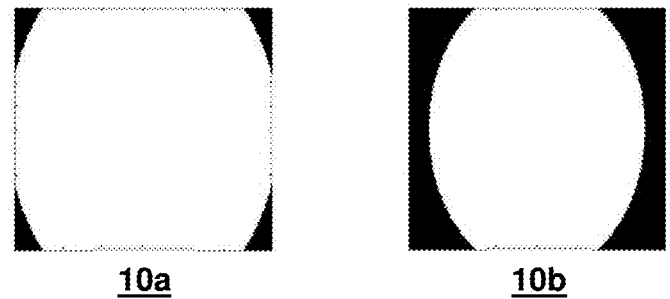
Figure 4B:
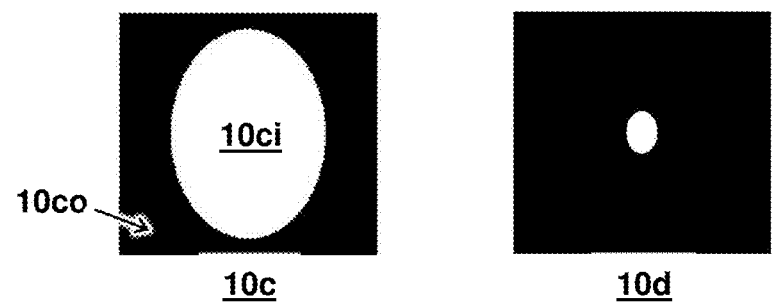

FIGS. 4A and 4B illustrate a first embodiment of a correction mask 10 and corresponding submask patterns 10a-10d, respectively.

In the first embodiment, the correction mask 10 has a central aperture with transparent material, e.g., glass. Accordingly, the mask grid layout M is formed by a plurality of submask patterns comprising opaque material distributed at different positions on the transparent material. For example, the mask 10 is manufactured as an ordinary lithographic reticle (by laser or e-beam writing) and antireflection coated to minimize the transmission losses.

In one embodiment, the submasks 10a have respective circular edges defining an area of blocked light. For example, centers of the circular edges of the submasks 10a are aligned with centers of the respective lenslets. In another or further embodiment, the circular edges of the submasks 10c define an inner area 10ci where light is passed through and an outer area 10co surrounding the inner area 10ci, where light is blocked. This may be used for correcting a relatively low light intensity at a center of the initial homogenized beam profile I1 and/or a relatively high light intensity at outer edges of the initial homogenized beam profile I1. (compare FIGS. 2A-2B and 5A-5B).

In the present embodiment, each of the submasks 10a-10d individually has a symmetric submask pattern. For example, the submask patterns are symmetric in a two orthogonal direction. For example, the submask patterns can be point symmetric. In one embodiment, the correction mask 10 includes a collection of two, three, four, or more differently patterned submasks 10a, 10b, 10c, 10d. For example, the correction mask 10 includes repeated occurrences of each pattern in a set of differently patterned submasks 10a, 10b, 10c, 10d.

Figure 5A:
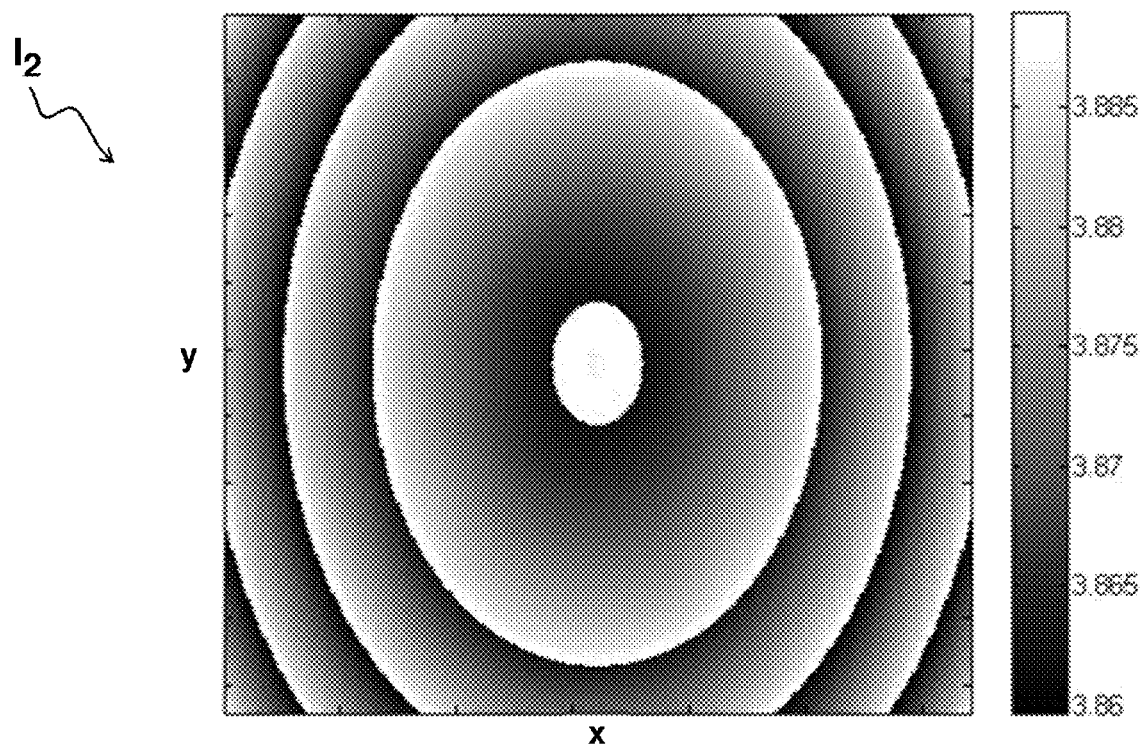
FIGS. 5A and 5B respectively illustrate a two dimensional and profile plot of a calculated intensity distribution of a further homogenized beam profile resulting from use of the correction mask according to the first embodiment.
Figure 5B:
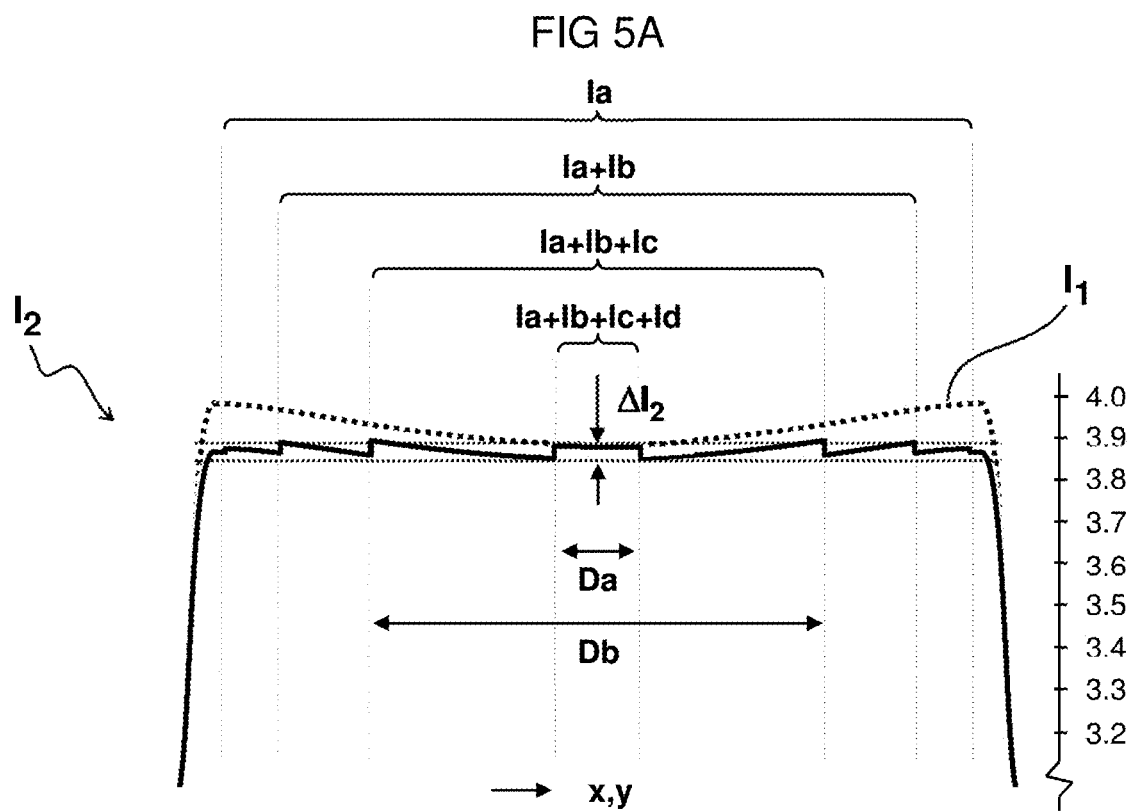

FIGS. 5A and 5B respectively illustrate a two dimensional and profile plot of a calculated intensity distribution of a further homogenized beam profile I2 resulting from use of the correction mask 10 according to the first embodiment (FIG. 4A).

As illustrated, the effect of the submasks may manifest as overlapping intensity profiles Ia-Id affected by the submasks 10a-10d, respectively. For example, the inner area Ia+Ib+Ic+Id may correspond to an original intensity where each of the submask 10a-10d passes the light. The ring area Ia+Ib+Ic around the inner area may correspond to light blocked by the submask 10d but passed by masks 10a-10c. The ring Ia+Ib may correspond to light blocked by the submask 10c and 10d but passed by submasks 10a and 10b. The ring Ia may correspond to light blocked by all submasks 10b-10d except the submask 10a. Of course, the edges between the different ring areas may be further smoothed, e.g. by using further different submask.

As illustrated, the further homogenized beam profile I2 has a further reduced light intensity variance (ΔI2) compared to the initial reduced light intensity variance (ΔI1) of the initial homogenized beam profile I1 of FIG. 2B (shown for comparison with dotted line in FIG. 5B).

As a non-limiting example illustrated by FIGS. 2A-2B, 3A-3B, 4A-4B, and 5A-5B, we may consider correction of a theoretical relative transmission of a projection stepper prototype, where it is desired that the illuminator unit (based on an imaging lenslet array homogenizer) and a projection lens in combination may result in an initial non-homogeneity (Imax-Imin)/(Imax+Imin)≈1.5%. See the profile I1 at FIGS. 2A-2B. In the current example, illustrated in FIG. 3A, we have 35×23 rectangular lenslets with dimensions 1.636 mm×2.5 mm. The initial beam I0 has Gaussian structure with 1/e^2 diameter of 44 mm. The distribution of beam power over the lenslets is shown in FIG. 3A.

To further correct for the non-homogeneity of 1.5% we apply masking to a number of lenslets covering ±1.5%=3% of the beam power in total. Splitting it to eight lenslets, we come to ~0.375% power per lenslet. Based on this criterion, we have selected eight lenslets in a symmetrical arrangement shown in FIG. 3A. e.g., to avoid a telecentricity change due to apodization and minimize the influence of intensity gradient over the lenslet area, the same mask may be applied to a pair of symmetrically positioned lenslets, four different submasks in total. A quadratic approximation of the relative illumination pattern I0 was split into four levels. Then the apodization masks were calculated as shown in FIGS. 4A-4B. The expected correction result Icorr(x,y) is shown in FIGS. 5A-5B, e.g. calculated as $$I_{corr}(x, y) = I_{rel}(x, y) \cdot \sum_{i,j} P_{i,j} \cdot T_{i,j}(x, y),$$

where Irel (x, y) is the relative illumination to be corrected, Pi, j is the power fraction and Ti, j (x,y) is the transmission profile of in a lenslet with indices (i, j). The resulting non-homogeneity of this procedure is 0.38%, i.e. a great improvement over the initial non-homogeneity of 1.5%.

Figure 6A:
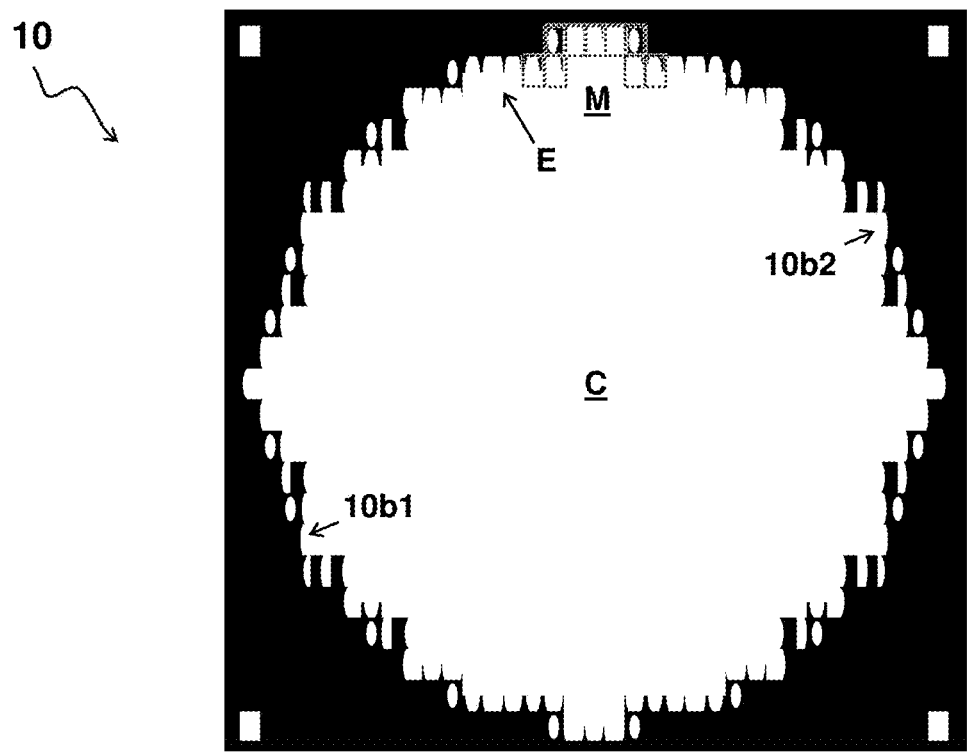
FIGS. 6A and 6B respectively illustrate a second exemplary embodiment of the invention including a correction mask and its corresponding submask patterns.
Figure 6B:
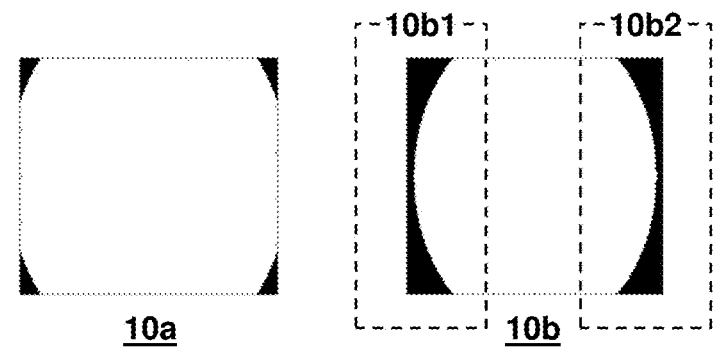
Figure 6B:
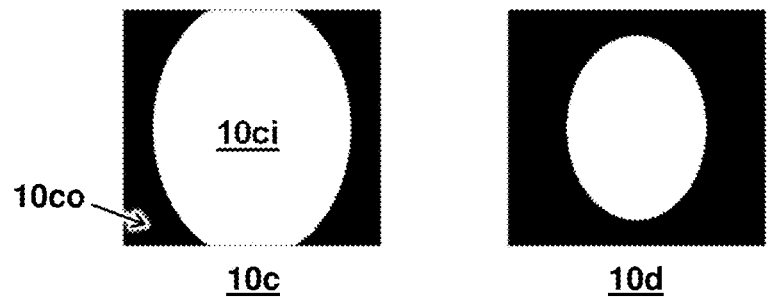

FIGS. 6A and 6B respectively illustrate a second embodiment of a correction mask and its corresponding submask patterns.

In the second embodiment, the correction mask 10 has a central aperture without material. Accordingly, the mask grid layout M is formed by a plurality of submask patterns disposed only around an edge E of the central aperture.

As shown, each of the submask patterns 10a-10d have a fixed position in the mask grid layout M of the correction mask 10. For example, wherein the correction mask 10 includes a plurality of submasks 10a that are distributed symmetrically about a center C of the mask grid layout M. Preferably they are arranged according to a point-symmetric distribution, as shown, e.g. wherein a first submask pattern 10b1 is the same as a half-turn rotated second submask pattern 10b2 opposite the center C, for being less sensitive to lateral shifting of a symmetric, e.g., Gaussian beam. In general, the sub-mask profile may be non-rotationally symmetric or non-symmetric at all.

Figure 7A:
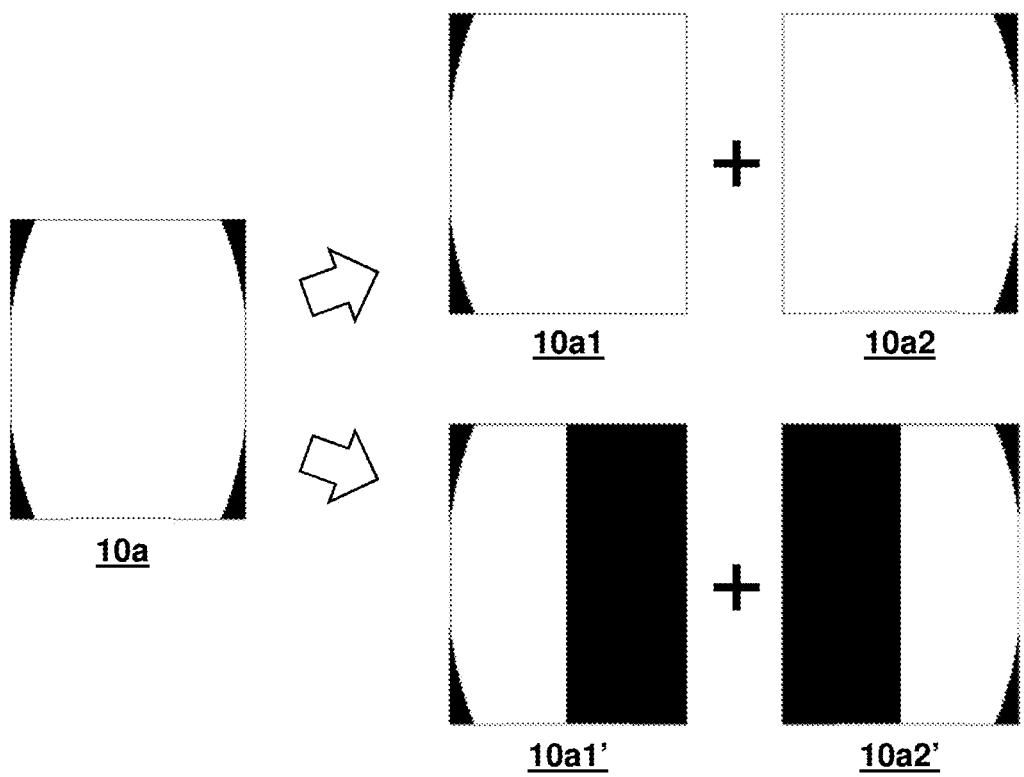
FIGS. 7A and 7B illustrate how an intended submask pattern with disconnected parts can be achieved at an edge of the correction mask according to the second embodiment.
Figure 7B:
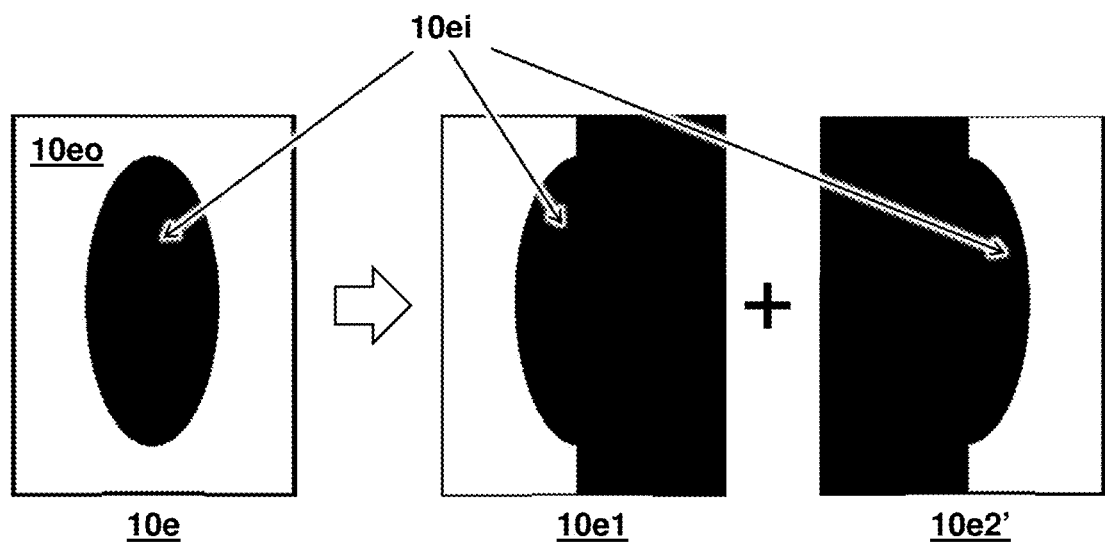

FIGS. 7A and 7B illustrate how an intended submask pattern with disconnected parts can be achieved at an edge of the correction mask according to the second embodiment.

In one embodiment, an intended symmetric submask pattern 10a or 10e including two or more disconnected parts is divided in subpatterns (e.g. 10a1, 10a2 or 10a1', 10a2' or 10e1, 10e2). Each subpattern is formed by a subset of the two or more disconnected parts to allow attachment of the subpattern to an edge of a central aperture without material. As shown e.g. in FIG. 6A, this allows forming patterns at an edge of the mask which would otherwise have disconnected parts floating in midair.

In some embodiments, the subpatterns 10a1, 10a2 form two halves that together make up the intended submask pattern 10a. For example, one half of a respective subpattern forms a respective half of the intended submask pattern 10a. Another half of a respective subpattern may be free of material (FIG. 7A top). Alternatively, another half of a respective subpattern is filled with opaque material, i.e. intended to block light of the incoming beam (FIG. 7A bottom, FIG. 7B).

In the embodiment of FIG. 7B, the circular edges 5 of the submasks 10e define an inner area 10ei where light is blocked and an outer area 10eo surrounding the inner area 10ei, where light is passed through for correcting a relatively high light intensity at a center of the initial homogenized beam profile and/or a relatively low light intensity at outer 10 edges of the initial homogenized beam profile. Leaving the remaining half open is preferable in terms of power efficiency. However, making it opaque may improve rigidity of the mask and provide connections to adjacent lenslet masks, which makes it possible to cover more lenslets. Some patterns benefit from adding the opaque parts to hold an otherwise floating 15 part of the submask. For example, the opaque halves shown on the right side of FIG. 7B may hold the inner area 10ei. The present figures show preferred embodiments wherein the submasks are symmetric and split symmetrically. In general, also non-symmetric patterns can be used which can also be split in non-symmetrically parts.

Figure 8A:
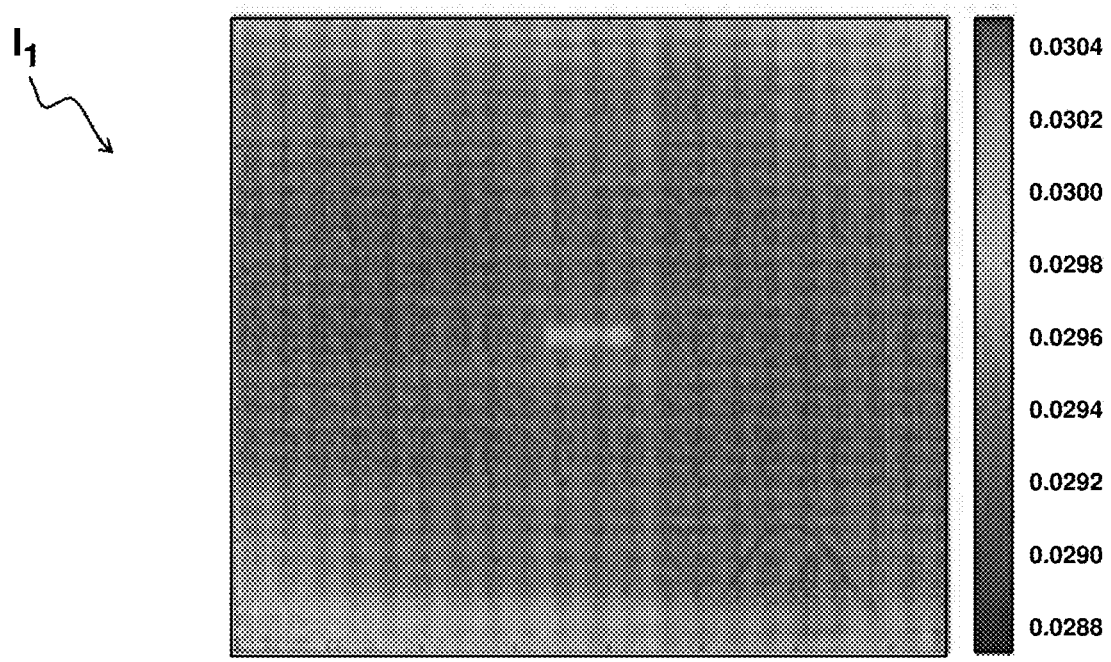
FIGS. 8A and 8B respectively illustrate measured intensity distributions of an initial homogenized beam profile and a further homogenized beam profile resulting from use of the correction mask according to the second embodiment.
Figure 8B:
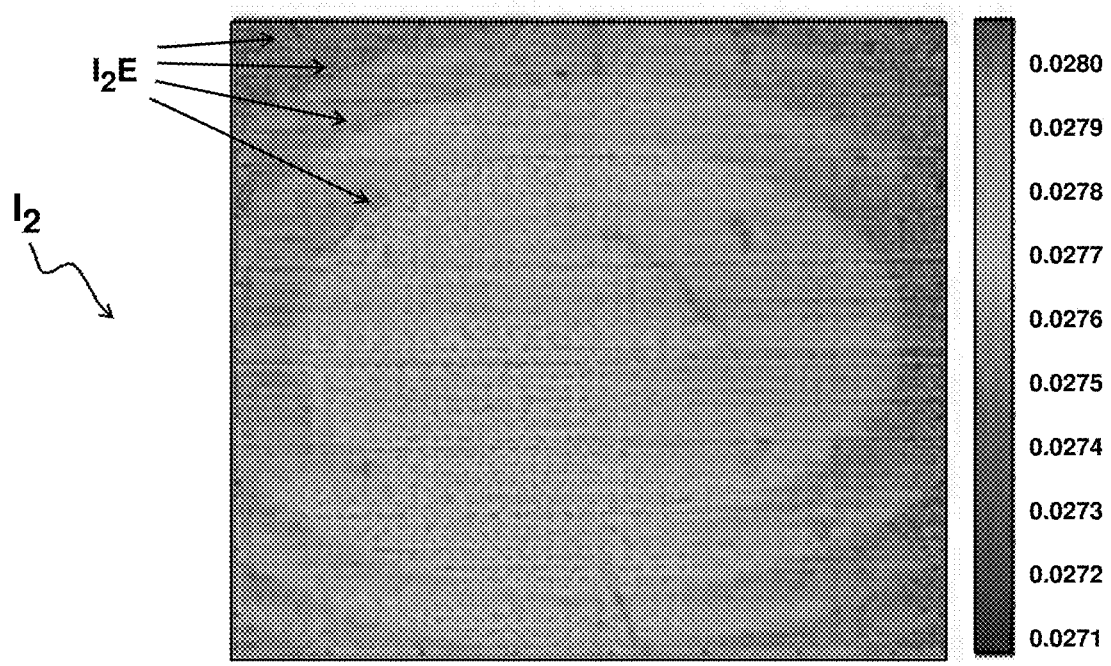

FIGS. 8A and 8B respectively illustrate measured intensity distributions of an initial homogenized beam profile I1 and a further homogenized beam profile I2 resulting from use of the correction mask according to the second embodiment.

Besides the fact that the intensity range in the image I2 is reduced with respect to I1, it will be appreciated that the further homogenized beam profile I2 shows edges I2E that may correspond to the edges of the submasks 10a,10b,10c, 10d. This may provide evidence of a correct alignment of the submasks with respect to lens array. Of course such edges may be further smoothed out by selecting a broader range of different submasks.

A mask 10 was manufactured by laser cutting according to the design shown in FIGS. 6A-6B, aligned with the first microlens array to fifty micrometer accuracy and tested in a homogenizer setup as illustrated in FIG. 1B. Analysis of the intensity profiles in FIGS. 8A-8B shows that non-homogeneity is reduced from 2.97% in a configuration with circular aperture to 1.94% with an apodization mask as described herein.

Some aspects of the present disclosure may provide a correction mask 10 e.g. as shown in FIG. 4A-4B or 6A-6B. For example, the correction mask 10 may be used for improving a homogenizer 100 based on a lens array 10 such as shown in FIG. 1B. This may provide a further homogenized beam profile I2 having a further reduced light intensity variance ΔI2 with respect to an initial homogenized beam profile I1 of the homogenizer 100 without the correction mask 10. For example compare FIGS. 2A-2B and 5A-5B. To achieve such homogenization, preferably the mask includes a plurality of submasks 10a arranged according to a mask grid layout M matching a lens grid layout L of the lens array 11. In use, the mask grid layout M is to be aligned with the lens grid layout L. Accordingly, each one of the submasks 10a is designed with a specific submask pattern to shape S the respective subarea of the initial beam profile I0 passing a specific one of the lenslets 11a. In another or further embodiment, the correction mask 10 is an apodization mask, e.g., aperture mask with a patterned edge.

Other or further aspects may relate to a method for manufacturing a correction mask 10 for improving an optical beam homogenizer 100. For example, as shown in FIGS. 1A-1B, the homogenizer 100 includes a lens array 11 configured to receive an incoming light beam B0 with an initial beam profile I0 having an initial light intensity variance ΔI0 to be homogenized. In the embodiment, the lens array 11 is formed by a plurality of lenslets 11a arranged according to a lens grid layout L spanning an area of the initial beam profile I0.

As shown in FIG. 1B, some embodiments may include configuring the correction mask 10 to provide a shaped initial beam profile I0', wherein a subset of the plurality of optical paths Pa between the incoming light beam B0 and the illumination plane 14 is at least partially blocked by the correction mask 10 to provide a further homogenized beam profile I2 having a further reduced light intensity variance ΔI2 with respect to the initial homogenized beam profile I1. Preferably, the mask includes a plurality of submasks 10a arranged according to a mask grid layout M matching the lens grid layout L of the lens array 11 as described herein.

As shown in FIGS. 2A-2B, some embodiments may include measuring an initial homogenized beam profile I1 at the illumination plane 14 of the optical beam homogenizer 100 without the correction mask 10. Alternatively, or in addition, embodiments may include designing the correction mask 10 by adding a plurality of submasks 10a,10b,10c,10d, e.g. as shown in FIG. 4A-4B or 6A-6B. For example, each submask can have an edge shaped to partially block a subarea of the initial beam profile I0 corresponding to a respective lenslet 11a. Accordingly, the blocked part of the subarea corresponds to a part of the measuring initial homogenized beam profile I1 having a higher than average light intensity I1H (see FIG. 2B).

As shown in FIGS. 3A-3B, some embodiments may include measuring the initial beam profile I0 of the incoming light beam B0 at a position where the correction mask 10 is to be placed. For example, it may be calculated what is the relative contribution Irel of light passing different subareas of the mask grid layout.

As shown in FIGS. 4A-4B or FIGS. 6A-6B, some embodiments may include generating a mask grid layout M of a correction mask 10 with different submask patterns 10a, 10b, 10c, 10d covering different subareas of the mask grid layout M;

As shown in FIGS. 5A-5B, some embodiments may include calculating a correction profile based on the different submask patterns 10a, 10b, 10c, 10d covering different subareas of the mask grid layout M and their relative contribution Irel wherein the correction profile Icorr is optimized to provide a further homogenized beam profile I2. For example, optimizing of the correction profile to provide the further reduced light intensity variance ΔI2 may include varying one or more of an edge shape of the different submask patterns, a number of each of the submask patterns used, and/or a position of the submask patterns with respect to the measured initial beam profile. For example, as illustrated in FIG. 5B, varying of the edge shape includes varying a respective diameter Da, Db of submask edges in one or more of the different submask patterns 10a, 10b.

For the purpose of clarity and a concise description, features are described herein as part of the same or separate embodiments, however, it will be appreciated that the scope of the invention may include embodiments having combinations of all or some of the features described. For example, while embodiments were shown for submask patterns, also alternative ways may be envisaged by those skilled in the art having the benefit of the present disclosure for achieving a similar function and result. E.g. optical components including lenses and masks may be combined or split up into one or more alternative components. The various elements of the embodiments as discussed and shown offer certain advantages, such as improving homogeneity. The presently shown embodiments wherein the correction mask is a binary mask may have advantages over masks with gray filters in that the binary mask is easy to manufacture having only one type of (fully) opaque areas covering a transmissive window or surrounding an aperture. Of course, it is to be appreciated that any one of the above embodiments or processes may be combined with one or more other embodiments or processes to provide even further improvements in finding and matching designs and advantages. It is appreciated that this disclosure offers particular advantages to lithography, and in general can be applied for any application wherein homogenous beam profiles are desired.

While the present systems and methods have been described in particular detail with reference to specific exemplary embodiments thereof, it should also be appreciated that numerous modifications and alternative embodiments may be devised by those having ordinary skill in the art without departing from the scope of the present disclosure. For example, embodiments wherein devices or systems are disclosed to be arranged and/or constructed for performing a specified method or function inherently disclose the method or function as such and/or in combination with other disclosed embodiments of methods or systems. Furthermore, embodiments of methods are considered to inherently disclose their implementation in respective hardware, where possible, in combination with other disclosed embodiments of methods or systems. Furthermore, methods that can be embodied as program instructions, e.g. on a non-transient computer-readable storage medium, are considered inherently disclosed as such embodiment.

Finally, the above-discussion is intended to be merely illustrative of the present systems and/or methods and should not be construed as limiting the appended claims to any particular embodiment or group of embodiments. The specification and drawings are accordingly to be regarded in an illustrative manner and are not intended to limit the scope of the appended claims. In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. The mere fact that certain measures are recited in mutually different claims does not indicate that a combination of these measures cannot be used to advantage. In particular, all working combinations of the claims are considered inherently disclosed.

The invention claimed is:

1. An optical beam homogenizer comprising:
a lens array configured to receive an incoming light beam with an initial beam profile having an initial light intensity variance to be homogenized, wherein the lens array is formed by a plurality of lenslets arranged according to a lens grid layout spanning an area of the initial beam profile, wherein each lenslet is arranged in a respective optical path to project a partial image of a respective subarea of the initial beam profile at an illumination plane, wherein a plurality of the partial images is projected to overlap at the illumination plane to form an initial homogenized beam profile of the initial beam profile at the illumination plane, wherein, by the overlapping the plurality of the partial images, the initial homogenized beam profile has an initial reduced light intensity variance with respect to the initial light intensity variance in the initial beam profile of the incoming light beam; and
a correction mask configured to provide a shaped initial beam profile, wherein a subset of the plurality of optical paths between the incoming light beam and the illumination plane is at least partially blocked by the correction mask to provide a further homogenized beam profile having a further reduced light intensity variance with respect to the initial homogenized beam profile;
wherein the correction mask includes a plurality of submasks arranged according to a mask grid layout matching the lens grid layout of the lens array, wherein the mask grid layout is aligned with the lens grid layout, wherein each one of the plurality of submasks is designed with a specific submask pattern to shape the respective subarea of the initial beam profile passing a specific one of the plurality of lenslets,
wherein the submask patterns of different ones of the plurality of submasks include different circular edges aligned with centers of the respective lenslets wherein the different circular edges are designed to differently shape the respective subareas of the initial beam profile passing different lenslets.

2. The optical beam homogenizer according to claim 1, wherein the different circular edges of the different submasks are projected as different ring areas providing the further reduced light intensity variance in the further homogenized beam profile.

3. The optical beam homogenizer according to claim 2, wherein the circular edges of the submasks define a circular inner area where light is passed through an outer area surrounding the circular inner area, where light is blocked for correcting a relatively low light intensity at a center of the initial homogenized beam profile and/or a relatively high light intensity at outer edges of the initial homogenized beam profile.

4. The optical beam homogenizer according to claim 2, wherein the circular edges of the submasks define a circular inner area where light is blocked and an outer area surrounding the circular inner area, where light is passed through for correcting a relatively high light intensity at a center of the initial homogenized beam profile and/or a relatively low light intensity at outer edges of the initial homogenized beam profile.

5. The optical beam homogenizer according to claim 2, wherein overlapping intensity profiles of the different submasks form the further homogenized beam profile, wherein an intensity profile of a first submask completely overlaps an intensity profile of a second submask.

6. The optical beam homogenizer according to claim 2, wherein the plurality of submasks includes at least some subset of the submasks having different shape or radius of edges and at least some subset of the submasks having the same edges shape and radius of edges, wherein members of a subset of submasks having the same shape and radius of edges are distributed symmetrically about a center of the mask grid layout, having a point-symmetric distribution.

7. The optical beam homogenizer according to claim 1, wherein the circular edges of the plurality of submasks define a circular inner area, where light is passed through, and an outer area surrounding the circular inner area, where light is blocked for correcting a relatively low light intensity at a center of the initial homogenized beam profile and/or a relatively high light intensity at outer edges of the initial homogenized beam profile.

8. The optical beam homogenizer according to claim 7, wherein overlapping intensity profiles of the different submasks form the further homogenized beam profile, wherein an intensity profile of a first submask completely overlaps an intensity profile of a second submask.

9. The optical beam homogenizer according to claim 1, wherein the circular edges of the plurality of submasks define a circular inner area where light is blocked and an outer area surrounding the circular inner area, where light is passed through for correcting a relatively high light intensity at a center of the initial homogenized beam profile and/or a relatively low light intensity at outer edges of the initial homogenized beam profile.

10. The optical beam homogenizer according to claim 9, wherein overlapping intensity profiles of the different submasks form the further homogenized beam profile, wherein an intensity profile of a first submask completely overlaps an intensity profile of a second submask.

11. The optical beam homogenizer according to claim 1, wherein overlapping intensity profiles of the different ones of the plurality of submasks form the further homogenized beam profile, wherein an intensity profile of a first submask completely overlaps an intensity profile of a second submask.

12. The optical beam homogenizer according to claim 1, wherein the plurality of submasks includes at least some subset of the plurality of submasks having different shape or radius of edges and at least some subset of the plurality of submasks having the same edges shape and radius of edges, wherein members of a subset of the plurality of submasks having the same shape and radius of edges are distributed symmetrically about a center of the mask grid layout, having a point-symmetric distribution.

13. The optical beam homogenizer according to claim 1, wherein the correction mask has a central aperture with transparent material, wherein the mask grid layout is formed by a plurality of submask patterns including an opaque material distributed at different positions on the transparent material.

14. The optical beam homogenizer according to claim 1, wherein the correction mask has a central aperture unaffected by the correction mask, wherein the mask grid layout is formed only by a plurality of submask patterns disposed around an edge of the central aperture.

15. The optical beam homogenizer according to claim 1, wherein the optical beam homogenizer is arranged in a light path of a lithographic system to homogeneously illuminate a reticle for projection and lithographic patterning onto a target substrate.

16. A correction mask for improving an optical beam homogenizer based on a lens array to provide a further homogenized beam profile having a further reduced light intensity variance with respect to an initial homogenized beam profile of the homogenizer without the correction mask,
the correction mask comprising: a plurality of submasks arranged according to a mask grid layout matching a lens grid layout of the lens array, wherein the mask grid layout is to be aligned with the lens grid layout, wherein each one of the plurality of submasks is designed with a specific submask pattern to shape a respective subarea of the initial beam profile passing a specific one of a plurality of lenslets forming the lens array;
wherein the submask patterns of different submasks include different circular edges to be aligned with centers of respective lenslets wherein the different circular edges are designed to differently shape the respective subareas of the initial homogenized beam profile passing different lenslets.

17. A method for manufacturing a correction mask for improving an optical beam homogenizer, the optical beam homogenizer including a lens array configured to receive an incoming light beam with an initial beam profile having an initial light intensity variance to be homogenized, wherein the lens array is formed by a plurality of lenslets arranged according to a lens grid layout spanning an area of the initial beam profile, wherein each lenslet is arranged in a respective optical path to project a partial image of a respective subarea of the initial beam profile at an illumination plane, wherein a plurality of the partial images is projected to overlap at the illumination plane to form an initial homogenized beam profile of the initial beam profile at the illumination plane, wherein the initial homogenized beam profile has an initial reduced light intensity variance with respect to the initial light intensity variance in the initial beam profile of the incoming light beam by the overlapping of the plurality of partial images, the method comprising:

configuring the correction mask to provide a shaped initial beam profile, wherein a subset of the plurality of optical paths (Pa) between the incoming light beam and the illumination plane is at least partially blocked by the correction mask to provide a further homogenized beam profile having a further reduced light intensity variance with respect to the initial homogenized beam profile;
wherein the correction mask includes a plurality of submasks arranged according to a mask grid layout matching the lens grid layout of the lens array, wherein the mask grid layout is to be aligned with the lens grid layout, wherein each one of the submasks is designed with a specific submask pattern to shape the respective subarea of the initial beam profile passing a specific one of the lenslets;
wherein the submask patterns of different ones of the plurality of submasks include different circular edges aligned with centers of the respective lenslets wherein the different circular edges are designed to differently shape the respective subareas of the initial beam profile passing different lenslets.

18. The method according to claim 17, wherein the method further comprises the steps of:
measuring an initial homogenized beam profile at the illumination plane of the optical beam homogenizer without the correction mask; and
designing the correction mask by adding a plurality of submasks, each submask having an edge shaped to partially block a subarea of the initial beam profile corresponding to a respective lenslet, wherein the blocked part of the subarea corresponds to a part of the measured initial homogenized beam profile having a higher than average light intensity.

19. The method according to claim 18, wherein the method further comprises the steps of:
measuring the initial beam profile of the incoming light beam at a position where the correction mask is to be placed;
calculating a relative contribution of light passing different subareas of the mask grid layout;
generating a mask grid layout of a correction mask with different submask patterns covering different subareas of the mask grid layout; and
calculating a correction profile based on the different submask patterns covering different subareas of the mask grid layout and their relative contribution wherein the correction profile is optimized to provide a further homogenized beam profile.

20. The method according to claim 19, wherein the optimizing of the correction profile to provide the further reduced light intensity variance includes varying one or more of an edge shape of the different submask patterns;
a number of each of the submask patterns used; and
a position of the submask patterns with respect to the measured initial beam profile.

* * * * *